US012665438B2

(12) United States Patent
Wang et al.

(10) Patent No.: US 12,665,438 B2
(45) Date of Patent: Jun. 23, 2026

(54) CHARGING DURATION DETERMINING METHOD, BMS, BATTERY, AND ELECTRICAL DEVICE

(71) Applicant: CONTEMPORARY AMPEREX TECHNOLOGY (HONG KONG) LIMITED, Hong Kong (CN)

(72) Inventors: Haijiang Wang, Ningde City (CN); Shuting Sun, Ningde City (CN); Shuai Huang, Ningde City (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 852 days.

(21) Appl. No.: 17/963,917

(22) Filed: Oct. 11, 2022

(65) Prior Publication Data

US 2023/0253816 A1 Aug. 10, 2023

Related U.S. Application Data

(63) Continuation of application No. PCT/CN2022/089767, filed on Apr. 28, 2022.

(30) Foreign Application Priority Data

Feb. 8, 2022 (CN) .......................... 202210118020.3

(51) Int. Cl.
*H02J 7/90* (2026.01)
*B60L 58/10* (2019.01)
(Continued)

(52) U.S. Cl.
CPC .............. *H02J 7/977* (2026.01); *B60L 58/26* (2019.02); *B60L 58/27* (2019.02); *G01R 31/367* (2019.01);
(Continued)

(58) Field of Classification Search
CPC . H02J 7/007194; H02J 7/00712; B60L 58/26; B60L 58/27; B60L 58/10;
(Continued)

(56) References Cited

U.S. PATENT DOCUMENTS

2018/0170208 A1 6/2018 Park
2022/0320872 A1 10/2022 Jiang et al.

FOREIGN PATENT DOCUMENTS

CN 103326405 A 9/2013
CN 108445400 A 8/2018
(Continued)

OTHER PUBLICATIONS

China National Intellectual Property Administration (CNIPA) The Second Office Action for 202210118020.3 Nov. 20, 2023 11 Pages (including translation).

(Continued)

*Primary Examiner* — Julian D Huffman
*Assistant Examiner* — Nathan J Instone
(74) *Attorney, Agent, or Firm* — ANOVA LAW GROUP, PLLC

(57) ABSTRACT

This application discloses a charging duration determining method, a BMS, a battery, and an electrical device. The method includes: determining a charge temperature of a battery; estimating, in a case that the charge temperature exceeds a first specified range, a first duration to be taken to adjust the charge temperature of the battery to the first specified range; estimating a second duration to be taken to charge the battery to a target SOC after the charge temperature of the battery has been adjusted to the first specified range; and determining, based on a charge start time of the battery, the first duration, and the second duration, a duration to be taken to charge the battery to the target SOC. The charging duration determined for the battery according to (Continued)

Determine a charge temperature of a battery, and estimate, in a case that the charge temperature exceeds a first specified range, a first duration to be taken to adjust the charge temperature of the battery to the first specified range — 501

Estimate a second duration to be taken to charge the battery to a target SOC after the charge temperature of the battery has been adjusted to the first specified range — 502

Determine, based on a charge start time of the battery, the first duration, and the second duration, a duration to be taken to charge the battery to the target SOC — 503 this application is more accurate, and facilitates users to accurately learn the charging status of the battery in time.

17 Claims, 3 Drawing Sheets

(51) Int. Cl.

| | | |
|---|---|---|
| *B60L 58/26* | (2019.01) | |
| *B60L 58/27* | (2019.01) | |
| *G01R 31/367* | (2019.01) | |
| *G01R 31/387* | (2019.01) | |
| *H01M 10/44* | (2006.01) | |

(52) U.S. Cl.
CPC .......... *G01R 31/387* (2019.01); *H01M 10/44* (2013.01); *H01M 10/443* (2013.01); *H02J 7/933* (2026.01); *B60L 58/10* (2019.02)

(58) Field of Classification Search
CPC ... G01R 31/367; G01R 31/387; H01M 10/44; H01M 10/443
USPC ........................................................ 320/153
See application file for complete search history.

(56) References Cited

FOREIGN PATENT DOCUMENTS

| | | | | |
|---|---|---|---|---|
| CN | 110109024 | A | * 8/2019 | .............. B60L 53/62 |
| CN | 111055722 | A | 4/2020 | |
| CN | 111175654 | A | 5/2020 | |
| CN | 111806296 | A | 10/2020 | |
| CN | 111999660 | A | 11/2020 | |
| CN | 112213641 | A | 1/2021 | |
| CN | 113553534 | A | 10/2021 | |
| CN | 113682200 | A | 11/2021 | |
| CN | 113836692 | A | 12/2021 | |
| CN | 113968160 | A | 1/2022 | |
| JP | H08115747 | A | 5/1996 | |
| JP | 2009254097 | A | 10/2009 | |
| JP | 2011182585 | A | 9/2011 | |
| JP | 2012191784 | A | 10/2012 | |
| JP | 2014121140 | A | 6/2014 | |
| JP | 2017049188 | A | 3/2017 | |
| WO | WO-2019187677 | A1 | * 10/2019 | ............ H01M 10/48 |

OTHER PUBLICATIONS

The European Patent Office (EPO) The Extended European Search Report for 22773578.4 Oct. 9, 2023 7 Pages.

The Chinese Patent Office (CPO) Notice of the first review opinion for CN Application No. 202210118020.3 Jun. 29, 2023 8 Pages (including English translation).

The World Intellectual Property Organization (WIPO) International Search Report and written opinion for PCT/CN2022/089767 Oct. 26, 2022 9 pages (including English translation).

China National Intellectual Property Administration (CNIPA) Decision of Rejection for Application No. 202210118020.3 Feb. 19, 2024 14 Pages (including translation).

The Japan Patent Office (JPO) Notification of Reasons for Refusal for Application No. 2022-562435 Apr. 9, 2024 10 Pages (including translation).

* cited by examiner vehicle
100

120 ---- motor controller

110 battery

10 battery
10 first part battery
module
20 box
30

301

302 second part battery
module
20 battery cell
210

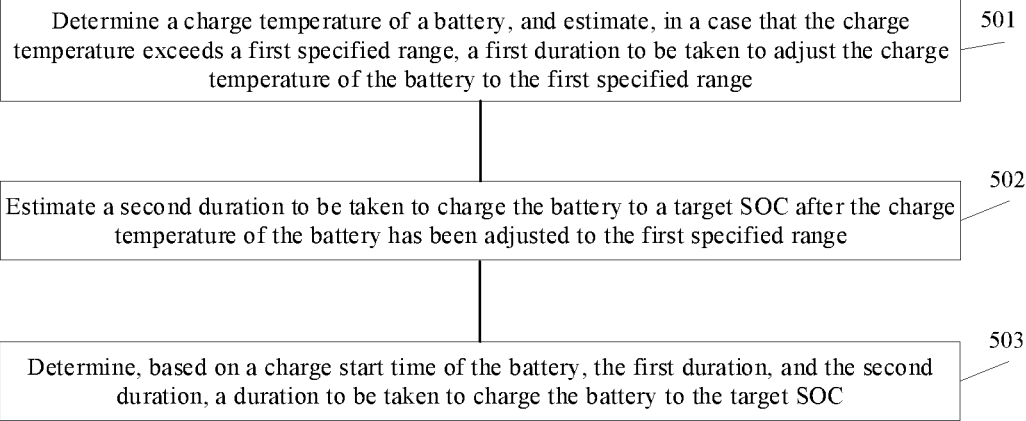

Determine a charge temperature of a battery, and estimate, in a case that the charge temperature exceeds a first specified range, a first duration to be taken to adjust the charge temperature of the battery to the first specified range    501

Estimate a second duration to be taken to charge the battery to a target SOC after the charge temperature of the battery has been adjusted to the first specified range    502

Determine, based on a charge start time of the battery, the first duration, and the second duration, a duration to be taken to charge the battery to the target SOC    503

FIG. 5

CHARGING DURATION DETERMINING METHOD, BMS, BATTERY, AND ELECTRICAL DEVICE

CROSS-REFERENCE TO RELATED APPLICATIONS

This application is a continuation application of PCT Patent Application No. PCT/CN2022/089767, entitled "CHARGING DURATION DETERMINING METHOD, BMS, BATTERY, AND ELECTRICAL DEVICE" filed on Apr. 28, 2022, which claims priority to Chinese Patent Application No. 202210118020.3, filed with the State Intellectual Property Office of the People's Republic of China on Feb. 8, 2022, and entitled "CHARGING DURATION DETERMINING METHOD, BMS, BATTERY, AND ELECTRICAL DEVICE", all of which are incorporated herein by reference in their entirety.

TECHNICAL FIELD

This application relates to the field of battery charging, and in particular, to a charging duration determining method, a battery management system (BMS), a battery, and an electrical device.

BACKGROUND

With the rapid popularization of new energy electric vehicles, a charging duration has become one of main concerns of many owners of electric vehicles used in daily life. Software algorithm-based accurate prediction of the time still to be taken to complete a charging process can provide an accurate time basis for the electric vehicle owners to reasonably schedule the use of the vehicle, work, and life. Currently, a charging duration of a battery is mostly determined by dividing a to-be-charged capacity by an output current value of a charging pile. This calculation method is merely ideal. In addition, the charging status of the battery changes with factors such as temperature during the charging, thereby leading to inaccuracy of the method for determining the charging duration, and causing a lot of inconvenience to users, especially to the vehicle owners.

SUMMARY

In view of the problem above, this application provides a charging duration determining method, a BMS, a battery, and an electrical device to accurately determine a charging duration of a battery in a charging state.

According to a first aspect, this application provides a charging duration determining method, including: determining a charge temperature of a battery; estimating, in a case that the charge temperature exceeds a first specified range, a first duration to be taken to adjust the charge temperature of the battery to the first specified range; estimating a second duration to be taken to charge the battery to a target SOC after the charge temperature of the battery has been adjusted to the first specified range; and determining, based on a charge start time of the battery, the first duration, and the second duration, a duration to be taken to charge the battery to the target SOC.

In embodiments of this application, a possible charging method for the battery is determined based on the charge temperature of the current charging environment. When the temperature is excessive or deficient, a part of a charge current of the battery is used to adjust the charge temperature first. When the temperature is adjusted to a value within the specified temperature range, the battery is charged according to a conventional charging method. In embodiments of this application, the current charge temperature is detected, and the method for determining a remaining charging duration of the battery is also adjusted based on a temperature detection result, so that the battery charging duration determined for the battery is more accurate.

In some embodiments, the estimating a first duration to be taken to adjust the charge temperature of the battery to the first specified range includes: calculating the first duration based on the charge temperature, a target temperature to which the temperature is to be adjusted, and a temperature rise rate, where the target temperature to which the temperature is to be adjusted is a value in the first specified range, and the charge temperature is lower than a minimum value in the first specified range.

In embodiments of this application, the first duration is determined based on the charge temperature and the target temperature to which the temperature is to be adjusted. That is, the duration to be taken to adjust the charge temperature of the battery from a current temperature to the first specified range serves as the first duration. Because a part of the charge current at this time is used to adjust the charge temperature of the battery, an output current of a charging pile is not the full charge current of the battery. Therefore, it is more accurate to determine the first duration by adjusting the temperature according to embodiments of this application. This example is pertinent to a case in which the charge temperature is lower than the first specified range.

In some embodiments, the estimating a first duration to be taken to adjust the charge temperature of the battery to the first specified range includes: calculating the first duration based on the charge temperature, a target temperature to which the temperature is to be adjusted, and a temperature drop rate, where the target temperature to which the temperature is to be adjusted is a value in the first specified range, and the charge temperature is higher than a minimum value in the first specified range.

In embodiments of this application, the first duration is determined based on the charge temperature and the target temperature to which the temperature is to be adjusted. That is, the duration to be taken to adjust the charge temperature of the battery from a current temperature to the first specified range serves as the first duration. Because a part of the charge current at this time is used to adjust the charge temperature of the battery, an output current of a charging pile is not the full charge current of the battery. Therefore, it is more accurate to determine the first duration by adjusting the temperature according to embodiments of this application. This example is pertinent to a case in which the charge temperature is higher than the first specified range.

In some embodiments, the estimating a second duration to be taken to charge the battery to a target SOC includes: determining a first SOC of the battery of which the charge temperature reaches the first specified range; determining a to-be-charged capacity of the battery based on the first SOC, the target SOC, and a cell capacity of the battery; and calculating the second duration based on the to-be-charged capacity and a charge current of a charger.

In embodiments of this application, in a case that the current charge temperature of the battery reaches the first specified temperature, the charging duration is determined based on the current SOC and the target SOC, and the determined charging duration is more accurate.

In some embodiments, the determining a first SOC of the battery of which the charge temperature reaches the first specified range includes: determining, in a case of both charging the battery and adjusting the charge temperature, an effective charge current of the battery based on a current consumed for adjusting the charge temperature of the battery and the charge current of the charger; and calculating the first SOC based on a current SOC of the battery, the cell capacity of the battery, the effective charge current, and the first duration.

In embodiments of this application, in a case that the battery is charged while the temperature is being adjusted, it is necessary to determine the current occupied for adjusting the temperature of the battery, so as to determine the effective charge current available for charging the battery. The battery charging duration so calculated is more accurate.

In some embodiments, the determining a first SOC of the battery of which the charge temperature reaches the first specified range includes: determining, in a case of only adjusting the charge temperature of the battery, that a current SOC of the battery is the first SOC.

In embodiments of this application, when it is determined that the battery is currently not charged but is only adjusted in temperature, the current SOC of the battery is used as the SOC to be applied for subsequently charging the battery that reaches the first temperature range, without a need to re-determine the current SOC of the battery, so as to improve efficiency of determining the battery charging duration.

In some embodiments, the method further includes: obtaining a maximum charge current of the charger and an actual output current coefficient of the charger; and determining that a product of the maximum charge current and the actual output current coefficient is the charge current of the charger.

In embodiments of this application, the maximum charge current of the charger such as a charging pile is obtained, and the output current coefficient thereof is obtained, so as to determine the current that is actually output for charging the battery. The battery charging duration so determined is more accurate.

In some embodiments, the obtaining an actual output current coefficient of the charger includes: determining the actual output current coefficient of the charger based on historical charge data of the battery.

In embodiments of this application, the actual output current coefficient may be determined based on the historical charge data of the charger. For example, the actual output current coefficient of the charger may be counted based on the nominal output current and historical actual output current of the charger, so as to improve the accuracy of the battery charging duration.

In some embodiments, the obtaining an actual output current coefficient of the charger includes: calculating the actual output current coefficient of the charger based on the maximum charge current of the charger and an actual charge current of the battery.

In embodiments of this application, the actual output current coefficient of the charger may be determined by directly calculating the current actual output current coefficient based on the nominal maximum charge current and the current actual output current of the charger.

In some embodiments, the method further includes: outputting, in response to arrival of a transmission period or a request message, information on the duration to be taken to charge the battery to the target SOC to a target object.

In embodiments of this application, the battery charging duration may be output by an electrical device such as a dashboard of an electric vehicle or an in-vehicle display unit, or the charging duration may be sent to an electronic device of the user through a network connection, so as to facilitate the user to learn the current charging duration and facilitate the user to schedule actions based on the charging duration. Embodiments of this application greatly facilitate the acquisition of the battery charging duration.

According to a second aspect, this application provides a battery management system, including a processor and a storage medium. A computer program is stored on the storage medium. When executed by the processor, the computer program is able to calculate a charging duration by using the charging duration determining method described above.

According to a third aspect, this application provides a battery, including a battery cell and the battery management system.

According to a fourth aspect, this application provides an electrical device, including a device body and a power supply. The power supply is the battery described above.

The foregoing description is merely an overview of the technical solutions of the embodiments of this application. The following expounds specific embodiments of this application to enable a clearer understanding of the technical means of the embodiments of this application, enable implementation based on the content of the specification, and make the foregoing and other objectives, features, and advantages of the embodiments of this application more evident and comprehensible.

BRIEF DESCRIPTION OF DRAWINGS

By reading the following detailed description of exemplary embodiments, a person of ordinary skill in the art becomes clearly aware of various other advantages and benefits. The drawings are merely intended to illustrate the exemplary embodiments, but not intended to limit this application. In all the drawings, the same reference numeral represents the same component. In the drawings:

FIG. 5 is a schematic flowchart of a charging duration determining method according to some embodiments of this application.

DETAILED DESCRIPTION OF EMBODIMENTS

Figure 1:
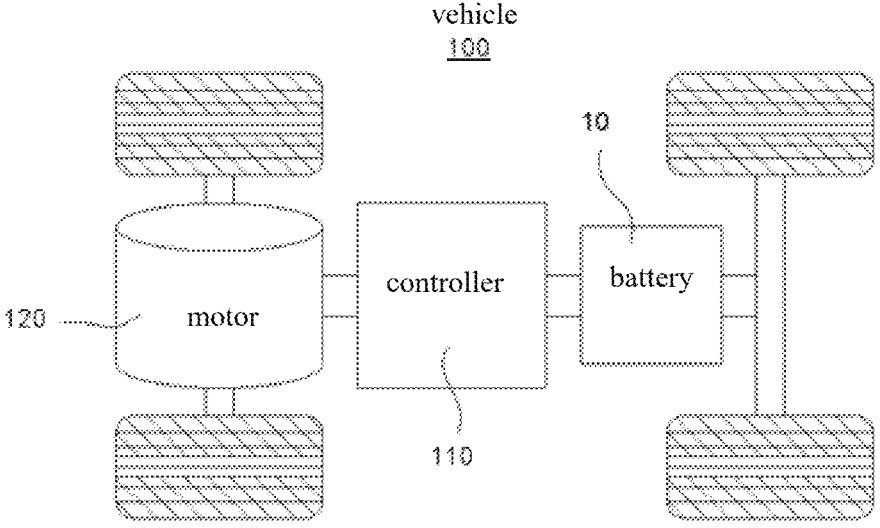
FIG. 1 is a schematic structural diagram of a vehicle according to some embodiments of this application.

Embodiments of the technical solutions of this application are described in detail below with reference to the drawings. The following embodiments are merely intended to describe the technical solutions of this application more clearly, and are merely exemplary but without hereby limiting the protection scope of this application.

Unless otherwise defined, all technical and scientific terms used herein have the same meanings as usually understood by a person skilled in the technical field of this application. The terms used herein are merely intended for describing specific embodiments but are not intended to limit this application. The terms "include" and "contain" and any variations thereof used in the specification, claims, and brief description of drawings of this application are intended as non-exclusive inclusion.

In the description of the embodiments of this application, the technical terms "first" and "second" are merely intended to distinguish different objects but not intended to indicate or imply relative importance or implicitly specify the number of the indicated technical features, the specific order, or order of priority. In the description of the embodiments of this application, unless otherwise expressly specified, "a plurality of" means two or more.

Reference to "embodiment" herein means that a specific feature, structure or characteristic described with reference to the embodiment may be included in at least one embodiment of this application. Reference to this term in different places in the specification does not necessarily represent the same embodiment, nor does it represent an independent or alternative embodiment in a mutually exclusive relationship with other embodiments. A person skilled in the art explicitly and implicitly understands that the embodiments described herein may be combined with other embodiments.

In the description of embodiments of this application, the term "and/or" merely indicates a relationship between related items, and represents three possible relationships. For example, "A and/or B" may represent the following three circumstances: A alone, both A and B, and B alone. In addition, the character "/" herein generally indicates an "or" relationship between the item preceding the character and the item following the character.

In the description of embodiments of this application, the term "a plurality of" means two or more (including two). Similarly, "a plurality of groups" means two or more groups (including two groups), and "a plurality of pieces" means two or more pieces (including two pieces).

In the description of embodiments of this application, a direction or a positional relationship indicated by the terms such as "center", "longitudinal", "transverse", "length", "width", "thickness", "up", "down", "before", "after", "left", "right", "vertical", "horizontal", "top", "bottom", "in", "out", "clockwise", "counterclockwise", "axial", "radial", and "circumferential" is a direction or positional relationship based on the illustration in the drawings, and is merely intended for ease or brevity of description of embodiments of this application, but not intended to indicate or imply that the indicated device or component is necessarily located in the specified direction or constructed or operated in the specified direction. Therefore, such terms are not to be understood as a limitation on embodiments of this application.

In the description of this application, unless otherwise expressly specified and qualified, the technical terms such as "mounting", "concatenation", "connection", and "fixing" need to be understood in a broad sense, for example, understood as a fixed connection or a detachable connection or understood as being integrated into a whole; or understood be as a mechanical connection or an electrical connection, a direct connection or an indirect connection implemented through an intermediary; or understood as interior communication between two components or interaction between two components. A person of ordinary skill in the art understands the specific meanings of the terms in the embodiments of this application according to the context.

Currently, as can be seen from the market trend, the application of power batteries is increasingly extensive. Power batteries are not only used in energy storage power systems such as hydro, thermal, wind, and solar power stations, but also widely used in electric means of transport such as electric bicycles, electric motorcycles, and electric vehicles, and used in many other fields such as military equipment and aerospace. The market demand for power batteries keeps expanding with the widening of the fields to which the power batteries are applicable.

The inventor hereof is aware that in a process of determining a remaining charging duration of a battery, the remaining charging duration of the battery is mostly determined based on a to-be-charged capacity of the battery and an output current value of a charging pile. However, a charge current of the battery varies with charging status of the battery. Especially, when a charge temperature of the battery is deficient or excessive, for example, lower than −10° C., in order to ensure normal working status of the battery, the charge temperature of the battery generally needs to be adjusted before the charging proceeds. Similarly, when the charge temperature of the battery is higher than 40° C., the charge temperature of the battery also needs to be adjusted before the charging proceeds. In this case, the charging duration of the battery that is still determined based on the output current of the charger is very inaccurate, and is adverse to scheduling of actions of users, especially for owners of electric vehicles.

In order to accurately determine the charging duration of the battery, the inventor hereof carries out research and finds that, in a case of charging the battery, the current charge temperature needs to be detected. When it is determined that the current charge temperature is not within a specified temperature range, the charging duration of the battery needs to determined based on an actual charge current. The charging duration so determined is more accurate and more significant.

The battery to which the charging duration determining method according to embodiments of this application is applied may be used in electrical devices such as a vehicle, watercraft, or aircraft, so as to facilitate the user to schedule actions based on the charging duration of the battery.

An embodiment of this application provides an electrical device powered by a battery to which the charging duration determining method is applied. The electrical device may be, but without being limited to, a mobile phone, a tablet, a notebook computer, an electric toy, an electric tool, an electric power cart, an electric vehicle, a ship, a spacecraft, and the like. The electric toy may include stationary or mobile electric toys, such as a game console, an electric car toy, an electric ship toy, an electric airplane toy, and the like. The spacecraft may include an airplane, a rocket, a space shuttle, a spaceship, and the like.

Referring to FIG. 1, FIG. 1 is a schematic structural diagram of a vehicle 100 according to some embodiments of this application. The vehicle 100 may be an oil-fueled vehicle, a natural gas vehicle, or a new energy vehicle. The new energy vehicle may be a battery electric vehicle, a hybrid electric vehicle, a range-extended electric vehicle, or the like. A battery 10 is disposed inside the vehicle 100. The battery 10 may be disposed at the bottom, front, or rear of the vehicle 100. The battery 10 may be configured to supply power to the vehicle 100. For example, the battery 10 may serve as an operating power supply of the vehicle 100. The vehicle 100 may further include a controller 110 and a motor 120. The controller 110 is configured to control the battery 10 to supply power to the motor 120, for example, to start or navigate the vehicle 100, or meet the operating power requirements of the vehicle in operation.

In some embodiments of this application, the battery 10 serves not only as an operating power supply of the vehicle 100, but may also serve as a drive power supply of the vehicle 100 to provide driving power for the vehicle 100 in place of or partially in place of oil or natural gas.

To meet different power use requirements, the battery 10 may include a plurality of battery cells 210. A battery cell 210 is a minimum unit that makes up a battery module or battery pack. A plurality of battery cells 210 may be connected together in series and/or parallel through electrode terminals, so as to be applied in various scenarios. A battery referred to in this application includes a battery module or a battery pack. The plurality of battery cells 210 may be connected in series, parallel, or series-and-parallel pattern. The series-and-parallel pattern means a combination of series connection and parallel connection. The battery 10 may also be referred to as a battery pack. In embodiments of this application, the plurality of battery cells 210 may directly make up a battery pack, or form a battery module 20 before a plurality of battery modules 20 make up a battery pack.

Figure 2:
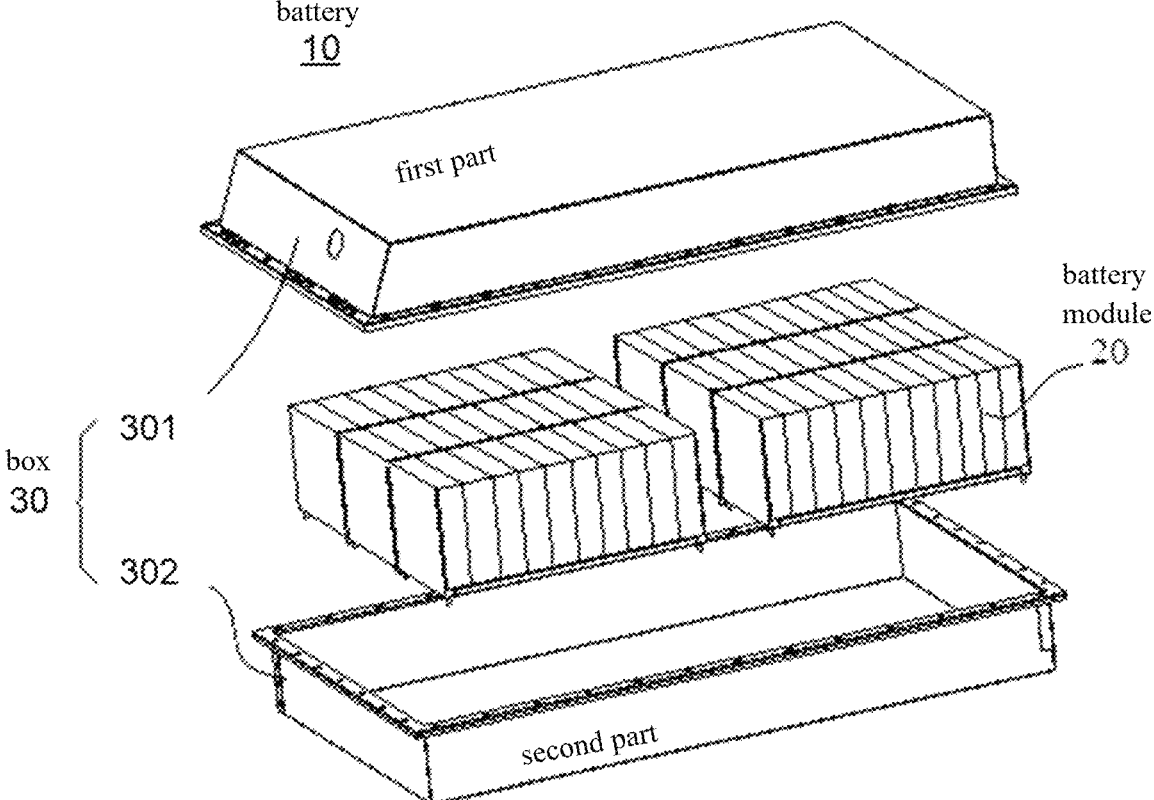
FIG. 2 is a schematic structural diagram of a battery according to an embodiment of this application.

FIG. 2 is a schematic structural diagram of a battery 10 according to an embodiment of this application. In FIG. 2, the battery 10 may include a plurality of battery modules 20 and a box 30. The plurality of battery modules 20 are accommodated in the box 30. The box 30 is configured to accommodate the battery cells 210 or the battery modules 20 to prevent liquid or other foreign matters from affecting the charge or discharge of the battery cells 210. The box 30 may be a simple three-dimensional structure such as a stand-alone cuboid or cylinder or sphere, or may be a complex three-dimensional structure compounded of simple three-dimensional structures such as cuboids, cylinders or spheres, without being limited herein. The material of the box 30 may be an alloy material such as aluminum alloy or iron alloy, or a polymer material such as polycarbonate or polyisocyanurate foam plastic, or a composite material compounded of glass fiber and epoxy resin, without being limited herein.

In some embodiments, the box 30 may include a first part 301 and a second part 302. The first part 301 and the second part 302 fit each other. The first part 301 and the second part 302 together define a space configured to accommodate the battery cell 210. The second part 302 may be a hollow structure opened at one end. The first part 301 may be a plate-like structure. The first part 301 fits on an opening side of the second part 302 so that the first part 301 and the second part 302 together define a space for accommodating the battery cell 210. Alternatively, both the first part 301 and the second part 302 may be hollow structures opened at one side. The opening side of the first part 301 fits with the opening side of the second part 302.

Figure 3:
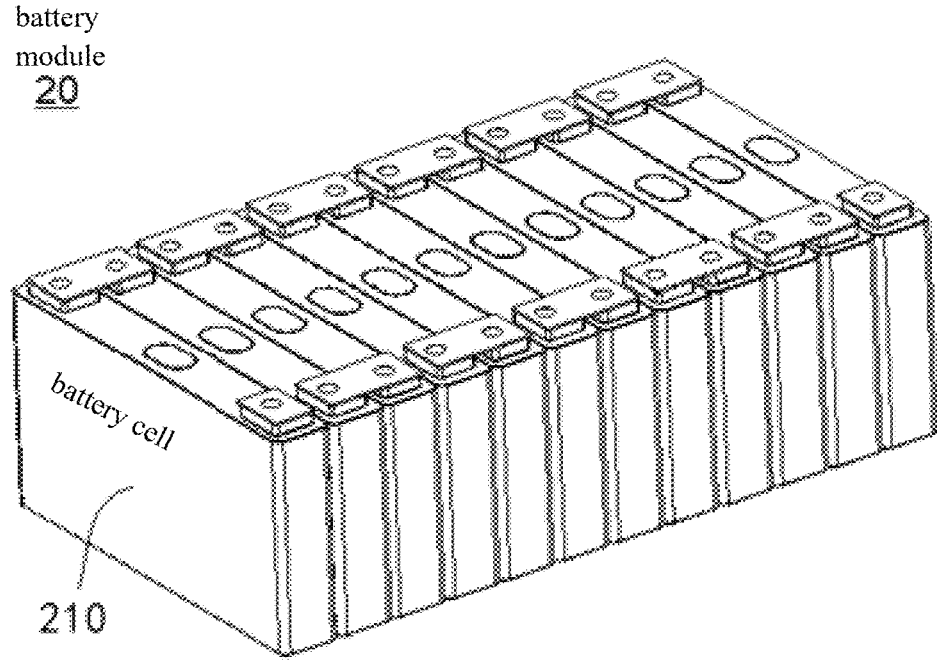
FIG. 3 is a schematic structural diagram of a battery module according to an embodiment of this application.

FIG. 3 is a schematic structural diagram of a battery module 20 according to an embodiment of this application. In FIG. 3, the battery module 20 may include a plurality of battery cells 210. The plurality of battery cells 210 may be connected in series, parallel, or series-and-parallel pattern to form a battery module 20, and then a plurality of battery modules 20 may be connected in series, parallel, or series-and-parallel pattern to form the battery 10. In this application, the battery cells 210 may include a lithium-ion battery, a sodium-ion battery, or a magnesium-ion battery, or the like, without being limited herein. The battery cell 210 may be in a cylindrical shape, a flat shape, a cuboidal shape, or other shapes, without being limited herein. Depending on the form of packaging, the battery cell 210 is typically classed into three types: cylindrical battery cell 210, prismatic battery cell 210, and pouch-type battery cell 210, without being limited herein. For brevity, the following embodiments are described by using a prismatic cell 210 as an example.

Figure 4:
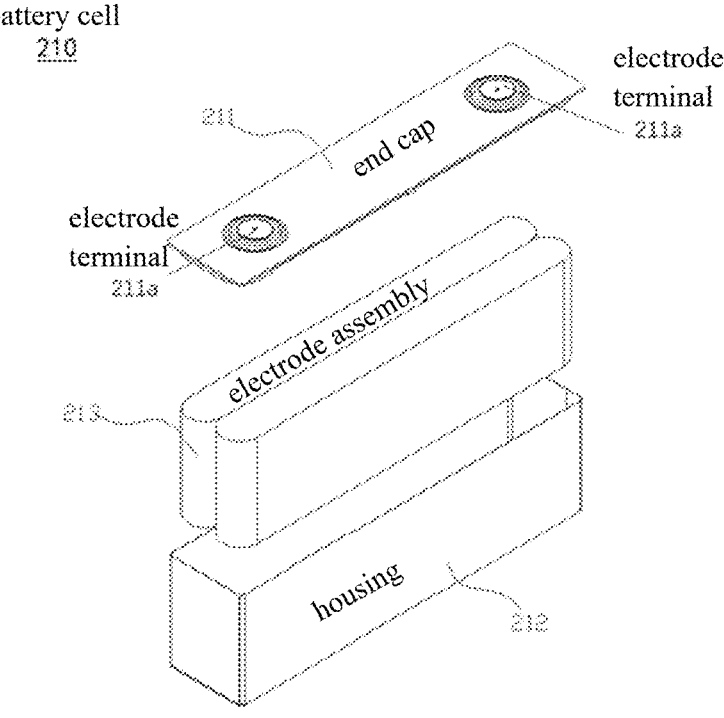
FIG. 4 is a schematic structural exploded view of a battery cell according to some embodiments of this application.

FIG. 4 is a schematic structural exploded view of a battery cell 210 according to some embodiments of this application.

The battery cell 210 is a minimum unit for making up a battery. As shown in FIG. 4, the battery cell 210 includes an end cap 211, a housing 212, an electrode assembly 213.

The end cap 211 is a component that fits with the opening of the housing 212 to isolate the internal environment of the battery cell 210 from the external environment. Without limitation, the shape of the end cap 211 may be adapted to the shape of the housing 212 to fit the housing 212. Optionally, the end cap 211 may be made of a material of appropriate hardness and strength (such as aluminum alloy), so that the end cap 211 is not prone to deform when squeezed or impacted. In this way, the battery cell 210 achieves higher structural strength and improves safety performance. Functional components such as electrode terminals 211a may be disposed on the end cap 211. The electrode terminals 211a may be configured to electrically connect to the electrode assembly 213 to output or input electrical energy of the battery cell 210. In some embodiments, a pressure relief mechanism configured to release an internal pressure when the internal pressure or temperature of the battery cell 210 reaches a threshold may be further disposed on the end cap 211. The end cap 211 may also be made of a variety of materials such as copper, iron, aluminum, stainless steel, aluminum alloy, or plastic, without being particularly limited herein. In some embodiments, an insulation piece may be further disposed on an inner side of the end cap 211. The insulation piece may be configured to isolate an electrically connected component in the housing 212 from the end cap 211 to reduce short-circuit risks. For example, the insulation piece may be plastic, rubber, or the like.

The housing 212 is a component configured to fit the end cap 211 to form an internal environment of the battery cell 210. The formed internal environment may be used to accommodate the electrode assembly 213, an electrolytic solution (not shown in the drawing), and other components. The housing 212 and the end cap 211 may be stand-alone components. An opening may be made on the housing 212. At the opening, the end cap 211 fits with the opening to form the internal environment of the battery cell 210. Without limitation, the end cap 211 and the housing 212 may be integrated instead. Specifically, the end cap 211 and the housing 212 may form a common connection interface before other components are put into the housing. Subsequently, when the interior of the housing 212 needs to be sealed, the end cap 211 is made to fit with the housing 212. The housing 212 may be in various shapes and sizes, such as a cuboid, cylinder, or hexagonal prism. Specifically, the shape of the housing 212 may be determined depending on the specific shape and size of the electrode assembly 213. The housing 212 may be made of a variety of materials such as copper, iron, aluminum, stainless steel, aluminum alloy, or plastic, without being particularly limited herein.

The electrode assembly 213 is a component that incurs electrochemical reactions in the battery cell 210. One or more electrode assemblies 213 may be contained in the housing 212. The electrode assembly 213 is mainly formed of a positive electrode plate and a negative electrode plate that are wound or stacked together. Generally, a separator is disposed between the positive electrode plate and the negative electrode plate. The parts, coated with an active material, of the positive electrode plate and the negative electrode plate, constitute a body portion of the electrode assembly. The part, coated with no active material, of the positive electrode plate and the negative electrode plate respectively, constitutes a tab (not shown in the drawing). The positive tab and the negative tab may be located at one end of the body portion together or at two ends of the body portion separately. In a charge-and-discharge process of the battery, the positive active material and the negative active material react with an electrolytic solution. The tabs are connected to electrode terminals to form a current circuit.

With the rapid popularization of new energy electric vehicles, a charging duration of the electric vehicles has become one of main concerns of many owners of electric vehicles used in daily life. Software algorithm-based accurate prediction of the time still to be taken to complete a charging process can provide an accurate time basis for the electric vehicle owners to reasonably schedule the use of the vehicle, work, and life. An existing method for calculating the remaining charging duration is:

> remaining charging duration=to-be-charged capacity (CAP_remain)/output current value of the charging pile.

According to the above calculation formula, the remaining charging duration in this charging process of the battery can be approximately calculated. According to the above calculation formula, the remaining charging duration in this charging process can be approximately calculated. However, under some special conditions, this calculation method leads to a gross error between the calculated remaining charging duration and the actual charging duration for lack of considering the influence of other factors in the charging process. A main factor that leads to the gross error of the full-charge remaining charging duration calculated according to this formula is: when the battery starts charging at low temperature (the charging starts at a low temperature in winter) or high temperature (the charging starts at a high temperature in summer), the calculation formula of the remaining charging duration ignores the impact caused by thermal management to the calculation error of the remaining charging duration at a start charging stage. At this stage, a thermal management load consumes the current, and the current actually charged into a battery pack is reduced.

Generally, when an electric vehicle is charged at a low temperature or high temperature, in order to ensure the charging safety and the charging speed, the temperature of the battery pack in the electric vehicle needs to be raised or dropped to an appropriate charge temperature range (20° C. to 35° C.) through an in-vehicle thermal management system before the charging proceeds. However, because an output power of a charging connector is constant (typically 3.3 kw, 6.6 kw, or the like), a thermal management system needs to consume current during thermal management. On condition that the output power of the charging connector is constant, the activated thermal management leads to decrease in the current actually charged into the battery pack, thereby prolonging the charging duration. If the calculation of the remaining charging duration ignores the impact caused by the decrease in the current actually charged into the battery pack arising from the activated thermal management, the error of calculating the remaining charging duration according to the above formula will become larger.

For example, when the electric vehicle starts charging at −10° C., the electric vehicle enters a stage of charging while heating, the output power of the charging pile is 3.3 kw, and the output current is assumed to be 6 A. If the thermal management is deactivated currently, the 6 A current output by the charging pile will be charged into the battery pack of the electric vehicle. However, due to the activated thermal management, the current actually charged into the battery pack is just 1 A to 2 A. In this case, the remaining charging duration of the battery calculated according to the foregoing battery charging duration calculation formula is approximately 3 to 6 times greater than the remaining charging duration calculated by using the 6 A current. After the thermal management is activated, the charge temperature of the electric vehicle reaches an appropriate target temperature through heating or cooling. After the thermal management is deactivated, the 6 A current output by the charging pile at this time will be charged into the battery pack of the electric vehicle. Therefore, in the actual charging process, the current actually charged into the battery pack is relatively low at the start stage when the thermal management is activated or deactivated. If the relatively low current is used to calculate the remaining charging duration at the charging start stage, a gross error will occur between the calculated remaining charging duration and the actual charging duration, thereby bringing a poor experience to the user of the electric vehicle.

To solve the above problem, an embodiment of this application provides a calculation method for improving precision of a remaining charging duration. When a vehicle enters a charging stage with a charging plug inserted, information exchange is completed between the charging pile and the vehicle, and internal communication is completed between the vehicle and a battery management system (BMS). The battery management system (BMS) calculates a value of a remaining charging duration of slow charging, and displays the value on the dashboard of the vehicle or on the charging pile, or sends the value to a terminal APP of the user.

FIG. 5 is a schematic flowchart of a charging duration determining method according to some embodiments of this application. As shown in FIG. 5, the charging duration determining method according to embodiments of this application includes the following steps:

Step 501: Determining a charge temperature of a battery, and estimating, in a case that the charge temperature exceeds a first specified range, a first duration to be taken to adjust the charge temperature of the battery to the first specified range.

According to some embodiments of this application, before the charging duration of the battery is determined, the charge temperature of the battery is detected. When the detected temperature is not within a specified temperature range, the charging duration of the battery needs to be estimated in other ways. In an embodiment of this application, the first specified range includes 5° C. to 35° C., 12° C. to 38° C., and the like. The specific range of the first specified range is not limited in this application, and may be set according to actual charging status of the battery, or the first specified range may be set according to different battery types, or the like.

Step 502: Estimating a second duration to be taken to charge the battery to a target SOC after the charge temperature of the battery has been adjusted to the first specified range.

According to some embodiments of this application, when it is determined that the current charge temperature is lower than the specified temperature, it is necessary to estimate a second duration to be taken to charge the battery to a target SOC after the charge temperature of the battery has been adjusted to the first specified range. The target SOC here may include 100%, and the like. Definitely, the target SOC may be set as required by the user. For example, the target SOC is set to 95%, 80%, or the like.

Step 503: Determining, based on a charge start time of the battery, the first duration, and the second duration, a duration to be taken to charge the battery to the target SOC.

According to some embodiments of this application, the charging duration of the battery, that is, the duration to be taken to charge the battery to the target SOC, can be determined based on the estimated first duration and second duration at the start stage of charging the battery, thereby providing the user with a relatively accurate charging duration of the battery, and facilitating the user to schedule actions or the like based on the charging duration.

In embodiments of this application, a possible charging method for the battery is determined based on the charge temperature of the current charging environment. When the temperature is excessive or deficient, a part of a charge current of the battery is used to adjust the charge temperature first. When the temperature is adjusted to a value within the specified temperature range, the battery is charged according to a conventional charging method. In embodiments of this application, the current charge temperature is detected, and the method for determining a remaining charging duration of the battery is also adjusted based on a temperature detection result, so that the battery charging duration determined for the battery is more accurate.

According to some embodiments of this application, the estimating a first duration to be taken to adjust the charge temperature of the battery to the first specified range includes: calculating the first duration based on the charge temperature, a target temperature to which the temperature is to be adjusted, and a temperature rise rate, where the target temperature to which the temperature is to be adjusted is a value in the first specified range, and the charge temperature is lower than a minimum value in the first specified range.

In embodiments of this application, the first duration is determined based on the charge temperature and the target temperature to which the temperature is to be adjusted. That is, the duration to be taken to adjust the charge temperature of the battery from a current temperature to the first specified range serves as the first duration. Because a part of the charge current at this time is used to adjust the charge temperature of the battery, an output current of a charging pile is not the full charge current of the battery. Therefore, it is more accurate to determine the first duration by adjusting the temperature according to embodiments of this application. This example is pertinent to a case in which the charge temperature is lower than the first specified range.

According to some embodiments of this application, the estimating a first duration to be taken to adjust the charge temperature of the battery to the first specified range includes: calculating the first duration based on the charge temperature, a target temperature to which the temperature is to be adjusted, and a temperature drop rate, where the target temperature to which the temperature is to be adjusted is a value in the first specified range, and the charge temperature is higher than a minimum value in the first specified range.

In embodiments of this application, the first duration is determined based on the charge temperature and the target temperature to which the temperature is to be adjusted. That is, the duration to be taken to adjust the charge temperature of the battery from a current temperature to the first specified range serves as the first duration. Because a part of the charge current at this time is used to adjust the charge temperature of the battery, an output current of a charging pile is not the full charge current of the battery. Therefore, it is more accurate to determine the first duration by adjusting the temperature according to embodiments of this application. This example is pertinent to a case in which the charge temperature is higher than the first specified range.

According to some embodiments of this application, the estimating a second duration to be taken to charge the battery to a target SOC includes:

determining a first SOC of the battery of which the charge temperature reaches the first specified range;

determining a to-be-charged capacity of the battery based on the first SOC, the target SOC, and a cell capacity of the battery; and calculating the second duration based on the to-be-charged capacity and a charge current of a charger.

In embodiments of this application, in a case that the current charge temperature of the battery reaches the first specified temperature, the charging duration is determined based on the current SOC and the target SOC, and the determined charging duration is more accurate.

According to some embodiments of this application, the determining a first SOC of the battery of which the charge temperature reaches the first specified range includes:

determining, in a case of both charging the battery and adjusting the charge temperature, an effective charge current of the battery based on a current consumed for adjusting the charge temperature of the battery and the charge current of the charger; and calculating the first SOC based on a current SOC of the battery, the cell capacity of the battery, the effective charge current, and the first duration.

In embodiments of this application, in a case that the battery is charged while the temperature is being adjusted, it is necessary to determine the current occupied for adjusting the temperature of the battery, so as to determine the effective charge current available for charging the battery. The battery charging duration so calculated is more accurate.

According to some embodiments of this application, the determining a first SOC of the battery of which the charge temperature reaches the first specified range includes: determining, in a case of only adjusting the charge temperature of the battery, that a current SOC of the battery is the first SOC.

In embodiments of this application, when it is determined that the battery is currently not charged but is only adjusted in temperature, the current SOC of the battery is used as the SOC to be applied for subsequently charging the battery that reaches the first temperature range, without a need to re-determine the current SOC of the battery, so as to improve efficiency of determining the battery charging duration.

According to some embodiments of this application, the method further includes:

obtaining a maximum charge current of the charger and an actual output current coefficient of the charger; and determining that a product of the maximum charge current and the actual output current coefficient is the charge current of the charger.

In embodiments of this application, the maximum charge current of the charger such as a charging pile is obtained, and the output current coefficient thereof is obtained, so as to determine the current that is actually output for charging the battery. The battery charging duration so determined is more accurate.

According to some embodiments of this application, the obtaining an actual output current coefficient of the charger includes: determining the actual output current coefficient of the charger based on historical charge data of the battery.

In embodiments of this application, the actual output current coefficient may be determined based on the historical charge data of the charger. For example, the actual output current coefficient of the charger may be counted based on the nominal output current and historical actual output current of the charger, so as to improve the accuracy of the battery charging duration.

According to some embodiments of this application, the obtaining an actual output current coefficient of the charger includes: calculating the actual output current coefficient of the charger based on the maximum charge current of the charger and an actual charge current of the battery.

In embodiments of this application, the actual output current coefficient of the charger may be determined by directly calculating the current actual output current coefficient based on the nominal maximum charge current and the current actual output current of the charger.

According to some embodiments of this application, the method further includes: outputting, in response to arrival of a transmission period or a request message, information on the duration to be taken to charge the battery to the target SOC to a target object.

In embodiments of this application, the battery charging duration may be output by an electrical device such as a dashboard of an electric vehicle or an in-vehicle display unit, or the charging duration may be sent to an electronic device of the user through a network connection, so as to facilitate the user to learn the current charging duration and facilitate the user to schedule actions based on the charging duration. Embodiments of this application greatly facilitate the acquisition of the battery charging duration.

The essence of the technical solutions of embodiments of this application is further clarified below through specific examples.

For working conditions in which the calculated remaining charging duration of an electric vehicle charged at a low or high temperature is inaccurate, calculation logic for a battery management system (BMS) to calculate the remaining charging duration is as follows:

Step 1: On condition that the battery is in a low- or high-temperature stage of slow charging, the start charge temperature (T_begin) is relatively low or high, and thermal management needs to be activated to heat or cool the battery to an appropriate target charge temperature (T_Target).

Step 2: Entering a start charging stage, for example, at a low temperature. At this time, it is necessary to estimate the remaining charging duration of the thermal management activated stage (Remaintime_TherManOpen). A specific calculation method is: (target charge temperature (T_Target)−start charge temperature (T_begin))/temperature rise rate.

In a case that the battery enters the charging stage at a high temperature, the remaining charging duration of the thermal management activated stage (Remaintime_TherManOpen) needs to be estimated according to the following formula: (target charge temperature (T_Target)−start charge temperature (T_begin))/temperature drop rate.

Step 3: After the temperature is adjusted to a value within the specified temperature range, the battery enters the start charging stage. At this time, if the battery is slow-charged at a low temperature or slow-charged at a high temperature, it is necessary to estimate the remaining charging duration value of the battery that has reached a corresponding target charge temperature through activation of thermal management. A calculation method of the remaining charging duration of the battery that has reached the target temperature through activation of thermal management is: (target SOC (SOC_Target) of charging−estimated SOC of the battery that has reached the target charge temperature through thermal management (SOC_NormalCharge))×battery cell capacity (Cap_Cell)/maximum current value (ACMaxCurr) available from the charging pile×actual output current coefficient (OBCOut_ratio).

In the start charging stage, thermal management is activated if the battery is slow-charged at a low temperature or slow-charged at a high temperature. The calculation method of the remaining charging duration of the battery that has reached the target charge temperature through thermal management is: current SOC value (SOC_Now)−(maximum current value available from the charging pile (ACMax-Curr)×actual output current coefficient (OBCOut_ratio)−current consumed for thermal management (Curr_Consume))×estimated remaining charging duration of the thermal management activated stage (Remaintime_TherManOpen).

According to some embodiments of this application, in the start charging stage, thermal management is activated if the battery is slow-charged at a low temperature or slow-charged at a high temperature, and the calculation logic of the remaining charging duration at this time is: estimated remaining charging duration of the thermal management activated stage (Remaintime_TherManOpen)+estimated remaining charging duration of the battery that has entered a normal steady charging process after reaching the target charge temperature through thermal management (Remaintime_NormalCharge). The remaining charging duration of the thermal management activated stage (Remaintime_TherManOpen) is calculated according to step 1 and step 2.

According to some embodiments of this application, this application further discloses a battery management system, including a processor and a storage medium. A computer program is stored on the storage medium. When executed by the processor, the computer program is able to calculate a charging duration by using the charging duration determining method described above.

According to some embodiments of this application, this application further provides discloses a battery, including a battery cell and the battery management system.

According to some embodiments of this application, this application further discloses an electrical device, including a device body and a power supply. The power supply is the battery described above.

The electrical device according to embodiments of this application may be any device or system that employs the battery described above.

Finally, it needs to be noted that the foregoing embodiments are merely intended to describe the technical solutions of this application but not to limit this application. Although this application is described in detail with reference to the foregoing embodiments, a person of ordinary skill in the art understands that modifications may still be made to the technical solutions described in the foregoing embodiments, or equivalent replacements may still be made to some or all technical features thereof. The modifications and equivalent replacements, which do not make the essence of the corresponding technical solutions depart from the scope of the technical solutions of the embodiments of this application, fall within the scope of the claims and specification hereof. Particularly, to the extent that no structural conflict exists, various technical features mentioned in various embodiments may be combined in any manner. This application is not limited to the specific embodiments disclosed herein, but includes all technical solutions falling within the scope of the claims.

What is claimed is:

1. A charging duration determining method, comprising:
determining a charge temperature of a battery;

activating, in response to the charge temperature being outside a first specified range, a thermal management device and controlling a charger such that a portion of a charge current is used by the thermal management device to adjust the charge temperature during a first duration and a remaining portion is supplied to the battery, the first duration being a duration to be taken to adjust the charge temperature of the battery to the first specified range;

estimating, in response to the charge temperature exceeding the first specified range, the first duration;

determining, for the first duration, an effective charge current for the battery as a difference between the charge current of the charger and a current consumed by the thermal management device;

determining a first state of charge (SOC) of the battery of which the charge temperature reaches the first specified range based on a current SOC of the battery, a cell capacity of the battery, the effective charge current, and the first duration;

estimating a second duration to be taken to charge the battery from the first SOC to a target SOC after the charge temperature of the battery has been adjusted to the first specified range;

determining, based on a charge start time of the battery, the first duration, and the second duration, a duration to be taken to charge the battery to the target SOC; and controlling the charger, after the charge temperature is within the first specified range, to charge the battery toward the target SOC in accordance with the determined duration.

2. The method according to claim 1, wherein the estimating the first duration comprises:

calculating the first duration based on the charge temperature, a target temperature to which the temperature is to be adjusted, and a temperature rise rate, wherein the target temperature to which the temperature is to be adjusted is a value in the first specified range, and the charge temperature is lower than a minimum value in the first specified range.

3. The method according to claim 1, wherein the estimating the first duration comprises:

calculating the first duration based on the charge temperature, a target temperature to which the temperature is to be adjusted, and a temperature drop rate, wherein the target temperature to which the temperature is to be adjusted is a value in the first specified range, and the charge temperature is higher than a minimum value in the first specified range.

4. The method according to claim 1, wherein the estimating the second duration to be taken to charge the battery from the first SOC to the target SOC comprises:

determining a to-be-charged capacity of the battery based on the first SOC, the target SOC, and the cell capacity of the battery; and calculating the second duration based on the to-be-charged capacity and the charge current of the charger.

5. The method according to claim 4, wherein the determining the first SOC of the battery of which the charge temperature reaches the first specified range comprises:

determining, when only adjusting the charge temperature of the battery, that a current SOC of the battery is the first SOC.

6. The method according to claim 4, wherein the method further comprises:

obtaining a maximum charge current of the charger and an actual output current coefficient of the charger; and determining that a product of the maximum charge current and the actual output current coefficient is the charge current of the charger.

7. The method according to claim 6, wherein the obtaining the actual output current coefficient of the charger comprises:

determining the actual output current coefficient of the charger based on historical charge data of the battery.

8. The method according to claim 6, wherein the obtaining the actual output current coefficient of the charger comprises:

calculating the actual output current coefficient of the charger based on the maximum charge current of the charger and an actual charge current of the battery.

9. The method according to claim 1, wherein the method further comprises:

outputting, in response to arrival of a transmission period or a request message, information on the duration to be taken to charge the battery to the target SOC to a target object.

10. A battery, comprising a processor and a storage medium storing a computer program that, when executed by the processor, implements a charging duration determining method including:

determining a charge temperature of a battery;

activating, in response to the charge temperature being outside a first specified range, a thermal management device and controlling a charger such that a portion of a charge current is used by the thermal management device to adjust the charge temperature during a first duration and a remaining portion is supplied to the battery, the first duration being a duration to be taken to adjust the charge temperature of the battery to the first specified range;

estimating, when the charge temperature exceeds the first specified range, the first duration;

determining, for the first duration, an effective charge current for the battery as a difference between the charge current of the charger and a current consumed by the thermal management device;

determining a first state of charge (SOC) of the battery of which the charge temperature reaches the first specified range based on a current SOC of the battery, a cell capacity of the battery, the effective charge current, and the first duration;

estimating a second duration to be taken to charge the battery from the first SOC to a target SOC after the charge temperature of the battery has been adjusted to the first specified range;

determining, based on a charge start time of the battery, the first duration, and the second duration, a duration to be taken to charge the battery to the target SOC; and controlling the charger, after the charge temperature is within the first specified range, to charge the battery toward the target SOC in accordance with the determined duration.

11. The battery according to claim 10, wherein the estimating the first duration comprises:

calculating the first duration based on the charge temperature, a target temperature to which the temperature is to be adjusted, and a temperature rise rate, wherein the target temperature to which the temperature is to be adjusted is a value in the first specified range, and the charge temperature is lower than a minimum value in the first specified range.

12. The battery according to claim 10, wherein the estimating the first duration comprises:

calculating the first duration based on the charge temperature, a target temperature to which the temperature is to be adjusted, and a temperature drop rate, wherein the target temperature to which the temperature is to be adjusted is a value in the first specified range, and the charge temperature is higher than a minimum value in the first specified range.

13. The battery according to claim 10, wherein the estimating the second duration to be taken to charge the battery from the first SOC to a target SOC comprises:

determining a to-be-charged capacity of the battery based on the first SOC, the target SOC, and a cell capacity of the battery; and calculating the second duration based on the to-be-charged capacity and the charge current of the charger.

14. The battery according to claim 13, wherein the determining the first SOC of the battery of which the charge temperature reaches the first specified range comprises:

determining, when only adjusting the charge temperature of the battery, that a current SOC of the battery is the first SOC.

15. The battery according to claim 13, wherein the method further comprises:

obtaining a maximum charge current of the charger and an actual output current coefficient of the charger; and determining that a product of the maximum charge current and the actual output current coefficient is the charge current of the charger.

16. The battery according to claim 10, wherein the method further comprises:

outputting, in response to arrival of a transmission period or a request message, information on the duration to be taken to charge the battery to the target SOC to a target object.

17. An electrical device comprising a device body and the battery according to claim 10.

* * * * *